(12) United States Patent
van Bavel et al.

(10) Patent No.: US 6,566,904 B2
(45) Date of Patent: May 20, 2003

(54) PAD CALIBRATION CIRCUIT WITH ON-CHIP RESISTOR

(75) Inventors: Nicholas van Bavel, Austin, TX (US); Pradeep Katikaneni, Austin, TX (US)

(73) Assignee: Cicada Semiconductor, Inc., Austin, TX (US)

( * ) Notice: Subject to any disclaimer, the term of this patent is extended or adjusted under 35 U.S.C. 154(b) by 0 days.

(21) Appl. No.: 09/850,530

(22) Filed: May 7, 2001

(65) Prior Publication Data

US 2002/0163355 A1 Nov. 7, 2002

(51) Int. Cl.[7] .............................................. H03K 12/16
(52) U.S. Cl. ............................ 326/30; 326/32; 326/34; 326/87
(58) Field of Search ............................. 326/30, 32, 86, 326/87

(56) References Cited

U.S. PATENT DOCUMENTS

| | | | |
|---|---|---|---|
| 5,194,765 A | | 3/1993 | Dunlop et al. |
| 5,243,229 A | | 9/1993 | Gabara et al. |
| 5,298,800 A | | 3/1994 | Dunlop et al. |
| 5,955,894 A | * | 9/1999 | Vishwanthaiah et al. ..... 326/86 |
| 6,127,862 A | * | 10/2000 | Kawasumi ................... 327/112 |
| 6,380,758 B1 | * | 4/2002 | Hsu et al. ..................... 326/30 |

OTHER PUBLICATIONS

Gabara, Thaddeus J. Knauer, Scott C.; "Digitally Adjustable Resistors in CMOS for High–Performance Applications," IEEE Journal of Solid–State Circuits, 8/92, pp. 1176–1185, vol. 27, No. 8.

\* cited by examiner

*Primary Examiner*—Michael Tokar
*Assistant Examiner*—Anh Q. Tran
(74) *Attorney, Agent, or Firm*—Gregory M. Howison; Howison & Arnott, LLP

(57) ABSTRACT

A pad calibration circuit with on-chip resistor. An integrated circuit with an impedance terminated output terminal is disclosed. A source is provided for sourcing current to the output terminal of the integrated circuit, which output terminal interfaces with a load having a finite impedance associated therewith. An on-chip source impedance is disposed internal to the integrated circuit and between the source and the output terminal to define the input impedance of the output terminal.

83 Claims, 8 Drawing Sheets

US 6,566,904 B2

PAD CALIBRATION CIRCUIT WITH ON-CHIP RESISTOR

TECHNICAL FIELD OF THE INVENTION

The present invention pertains in general to calibration circuits for an I/O pad on an integrated circuit and, more particularly, to a calibration circuit for an I/O pad that interfaces with a transmission line in an Ethernet system, which calibration circuit calibrates an on-chip resistor that is utilized to source terminate the transmission line.

BACKGROUND OF THE INVENTION

Data traffic between remote stations in various networks has seen a steady increase over the last decade or so. As the data traffic increases, so does the need for bandwidth, although present network interconnections have some difficulty in keeping up with the bandwidth demand. One of these networks is Ethernet and the highest data rate is that associated with the 1000BT Ethernet controllers that allow up to a Gigabit of data to be transferred per second. However, the speed of these controllers present new problems to the designer that must be solved when interfacing with the existing network media, such as a twisted wire transmission pair, coaxial cable or optical fiber, and when interfacing with other integrated circuits on the controller, such as between the physical layer device (PHY) and the Media Access Controller (MAC).

In a typical 1000BT Ethernet controller, there is typically provided a PHY integrated circuit for interfacing between the network media, i.e., a twisted wire pair, and the MAC. This typically involves a transmission line disposed between pins on the PHY and the MAC for receiving incoming data and transmitting outgoing data, in addition to carrying various clock signals between the two integrated circuits. Therefore, each driver on the Ethernet controller must interface with the impedance of the transmission line when carrying data from the PHY to the MAC and from the MAC to the PHY, and present thereto an equal impedance to minimize reflections and provide a match therefor. This can present a problem, in that the output impedance of the driver is typically relatively low compared to the impedance of the transmission line between the PHY and the MAC. One method for matching the driver to the impedance of the transmission line is to utilize an external resistance disposed between the driver and the transmission line. By adding a series resistance between the driver and the transmission line, the overall output impedance presented to the transmission line would be adjusted to 50 ohms, and therefore, this would provide a match, thus reducing reflections. The problem with source terminating the pad when utilizing an integrated circuit is the fact that the resistor must be fabricated on the integrated circuit, this typically requiring some type of polycrystalline resistor. These types of resistors are prone to process and temperature variations. Therefore, they would require some type of process and temperature compensation, and some type of trimming in order to account for the process variations.

SUMMARY OF THE INVENTION

The present invention disclosed and claimed herein, in one aspect thereof, comprises an integrated circuit with an impedance terminated output terminal. A source is provided for sourcing current to the output terminal of the integrated circuit, which output terminal interfaces with a load having a finite impedance associated therewith. An on-chip source impedance is disposed internal to the integrated circuit and between said source and the output terminal to define the input impedance of the output terminal.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
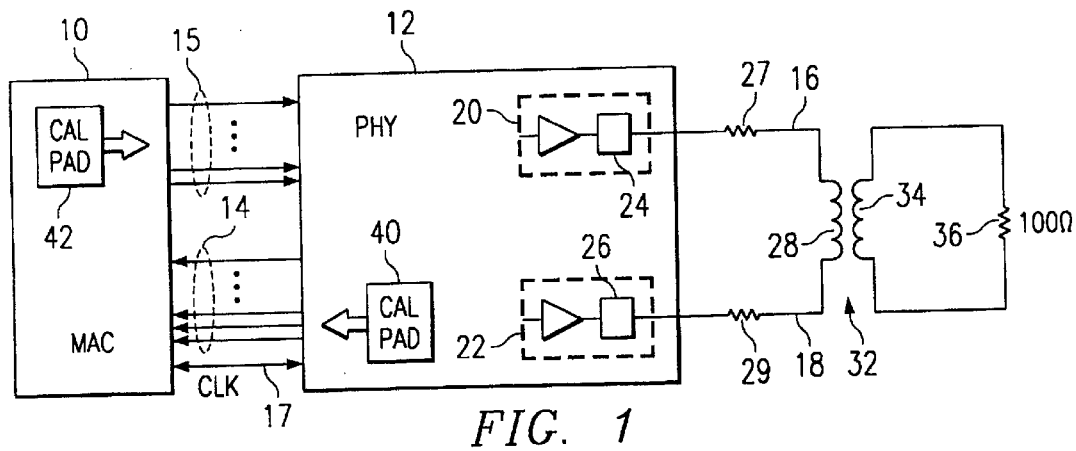
FIG. 1 illustrates an overall diagrammatic view of the Ethernet controller for interfacing with a transmission line.

Referring now to FIG. 1, there is illustrated a top level diagram of the Ethernet controller, which is comprised of a media access control (MAC) 10 and a physical layer 12, which are connected together through data lines 14 for received data from the PHY to the MAC 10 and data lines 15 for transmitted data from the MAC 10 to the PHY 12. There is also provided clock lines 17 for carrying timing information between the PHY 12 and the MAC 10. The physical layer 12 is typically that portion of the Ethernet controller that is associated with the encoder/decoder function and the driver/receiver function in addition to the interface to the physical medium. In the illustrated embodiment of FIG. 1, the physical medium is a transmission line comprised of a single twisted wire pair which has two lines 16 and 18, lines 16 connected to a first PAD 20 in the physical area block 12 and the line 18 interfaced with a second PAD 22 in the physical area device 12. The term PAD refers to the pad driver circuitry which is associated with an actual physical pad, there being a physical pad 24 associated with the PAD 20 and a physical pad 26 associated with the PAD 22. Each interface to an integrated circuit must have some type of pad, which pad typically comprises a physical termination pad on the integrated circuit, which typically has a bond wire connected from the actual pad to an external connector on the integrated circuit package. Alternatively, other connection devices are provided, such as solder balls. The pad has associated therewith capacitance and inductance, all of which contribute to the impedance thereof.

The pad 24 on the output of the PHY 12 is connected through a series resistor 27 to one side of an input 28 of a transformer 32, the other side of the transformer 32 on the input 28 side connected through a series resistor 29 to the pad 26. The resistors 27 and 29 have an impedance of approximately 50 ohms. An output 34 of the transformer 32 is connected to a 100 ohm impedance 36, which comprises the load to the system. As such, the output of the PHY 12 will see a 50 ohm load thereto due to the resistors 27 and 29.

The data lines 14 and 15 each comprise transmission lines. When data is received from the twisted wire pair, it is processed by PHY 12 and then directed through data transmission lines 14 to the MAC 10. These transmission lines must present a 50 ohm impedance to the PHY 12. In addition, when data is transmitted from the MAC 10 to the PHY 12, a 50 ohm transmission line is also required. In order to provide a 50 ohm impedance to the PHY 12, the present disclosure utilizes a calibrated resistor pad 40 for driving the data lines 14 in the PHY 12. The MAC 10 can also include a calibrated resistor pad 42. This will be described hereinbelow. However, in operation, the calibrated resistor pad 40 and/or the calibrated resistor pad 42 provides an on chip series impedance that is calibrated to provide the termination impedance to the data lines 14 or the data lines 15, such that an external resistor is not required. Again, this will be described in more detail hereinbelow.

Figure 2:
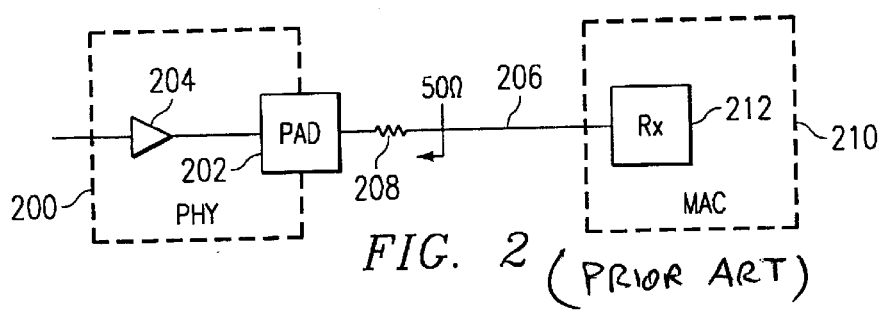
FIG. 2 illustrates a prior art illustration of a pad termination.

Referring now to FIG. 2, there is illustrated a simplified schematic of a prior art system for providing a termination impedance, which illustrates an integrated circuit 200 comprised of the PHY having a physical pad 202 associated therewith. The physical pad 202 has a driving circuit 204 disposed on the chip which is operable to drive the pad 202 with a signal. The pad 202 is interfaced with a transmission line 206 through a series resistor 208. If the source impedance into the pad 202 is relatively low, on the order of two or three ohms, then the resistor 208 must be approximately 46 to 47 ohms to provide an impedance of 50 ohms looking into the transmission line 206 toward a receiver 212 on an integrated circuit 210 such as the MAC, which receiver 212 is essentially a capacitive load.

Figure 3:
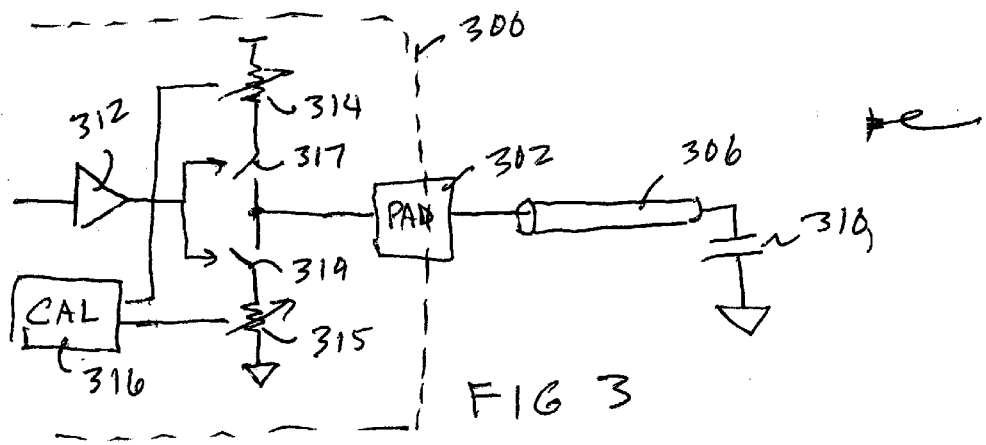
FIG. 3 illustrates a simplified diagram of the source terminated PAD of the present disclosure.

Referring now to FIG. 3, there is illustrated a simplified diagram of the calibrated on-chip resistor pad of the present disclosure. An integrated circuit 300 is illustrated as having a physical pad 302 associated therewith which is interfaced external to the integrated circuit 300 with a transmission line 306, the transmission line 306 connected to one side of a capacitive load 310. The physical pad 302 is driven with a first gated on-chip resistor 314 from $V_{cc}$ and sourced with a second on-chip resistor to ground, the resistors 314 and 315 gated with gates 317 and 319, respectively. The gates 317 and 319 are gated with a gating circuit 312. The output of the gates 317 and 319 are connected to the pad 302. The resistance of the resistors 314 and 315 are calibrated resistances. The calibration of these resistances is provided by a calibration engine 316, which calibration engine 316 is operable to periodically calibrate the resistance value of the resistor 314. This is facilitated by, in one embodiment, continually determining the required resistance calibration values to maintain the resistance at a substantially constant value, over temperature and environmental conditions. Additionally, such calibration will account for process variations. This calibration engine 316 operates in a periodic mode. In the disclosed embodiment, as will be described hereinbelow, the calibration engine is cyclic in nature and operates over predetermined periods. However, the calibration engine 316 could operate based upon external environmental factors, based upon a user directed calibration signal or on a process based calibration signal. As will also be described hereinbelow, the calibration engine 316 utilizes a dummy PAD associated with a dummy physical pad and a reference voltage to simulate a predetermined voltage, which reference voltage is process, temperature and voltage variant. However, the calibration engine 316 could utilize some type of lookup table or template matching operation. For discussion purposes, "PAD" refers to all of the circuitry that is associated with the I/O function of the physical "pad," such as the drivers.

Figure 4:
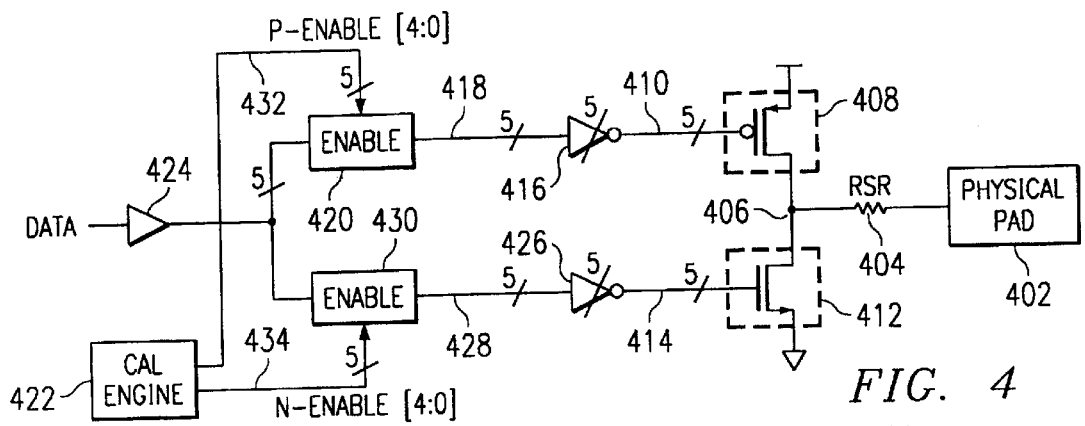
FIG. 4 illustrates a simplified schematic diagram of the driver of the PAD circuitry for providing a calibrated termination internal to the integrated circuits.

Referring now to FIG. 4, there is illustrated a simplified schematic of the PAD circuitry for driving a physical pad 402. The physical pad 402 has interfaced therewith internal to the integrated circuit a fixed resistor 404, which is a polycrystalline resistor fabricated on the semiconductor substrate on which the integrated circuit is fabricated. This polycrystalline resistor is subject to process, and temperature variations. Of the desired 50 ohms of impedance that is presented to the output of the integrated circuit, approximately 30 ohms are associated with fixed resistor 404, the remaining 20 ohms associated with the calibrated resistance.

The fixed resistor 404 is connected between the physical pad 402 and a driving node 406. The driving node 406 is driven from $V_{dd}$ through a p-channel transistor structure 408. As will be described hereinbelow, the p-channel transistor structure 408 is comprised of a plurality of parallel connectable p-channel transistors with the gates thereof connected to separate lines of a 5-bit bus 410 plus at least one fixed p-channel transistor.

The node 406 is pulled to ground or $V_{ss}$ through an n-channel transistor structure 412, similar to the p-channel transistor structure 408, in that it is comprised of a plurality of parallel connectable n-channel transistors. The gates of the transistors in the transistor structure 412 are separately connectable to separate lines of a 5-bit bus 414 plus at least one fixed n-channel transistor.

Each of the transistor structures 408 and 412 comprise a transconductance that can be set to a desired value, which value is approximately 20 ohms. The transistor structure 408 is operable to provide resistance when driving from the $V_{dd}$ source to the node 406, and the transistor structure 412 is operable to sink current from the node 406 to ground, the direction of current depending upon the logic state on the input. Therefore, there will be a p-channel current through transistor structure 408 and an n-channel current through transistor structure 412. As will be described hereinbelow, the number of transistors that are connected in parallel, i.e., the overall resistance, is controlled with various enable signals. These enable signals determine how many of the transistors in each of the transistor structures 408 and 412 are selected to achieve the overall needed resistance, it being understood that different numbers of transistors can be selected for the p-channel current and the n-channel current.

The bus 410 is driven by a five-input inverter circuit 416, which has the input connected to a 5-bit bus 418, which is driven by an enable circuit 420, this being a circuit to select the desired one(s) of the lines of the bus 418. Since the inverter 416 inverts the signal, whenever one of the lines is driven low, that will drive current through the corresponding transistor in the transistor structure 408. When not selected, it will always be held high. The enable block 420 is driven by calibration engine 422, the operation of which will be described hereinbelow. The actual signal to all the lines is derived from a data signal driven through an inverter 424, the output which is connected to the enable circuit 420.

Similar to the p-channel current side, the n-channel current side associated with the transistor structure 412 has the five lines of the bus 414 driven by an inverter structure 426, the input thereof connected through a 5-bit bus 428 to an n-channel enable circuit 430. The n-channel circuit 430 is driven by the calibration engine 412. The calibration engine 422 is operable to drive a p-enable signal on a 5-bit bus 432 to drive the p-channel enable circuit 420 and provide an n-enable signal on a 5-bit bus 434 to drive the n-channel enable block 430. In operation, the calibration engine 422 determines how many, and which, of the transistors in the transistor structure 408 and the transistor structure 412 will be turned on. As will further be described hereinbelow, these are binary-weighted transistors. Once this determination is made, the enable signals will be latched to the enable circuits 420 and 430.

Figure 5:
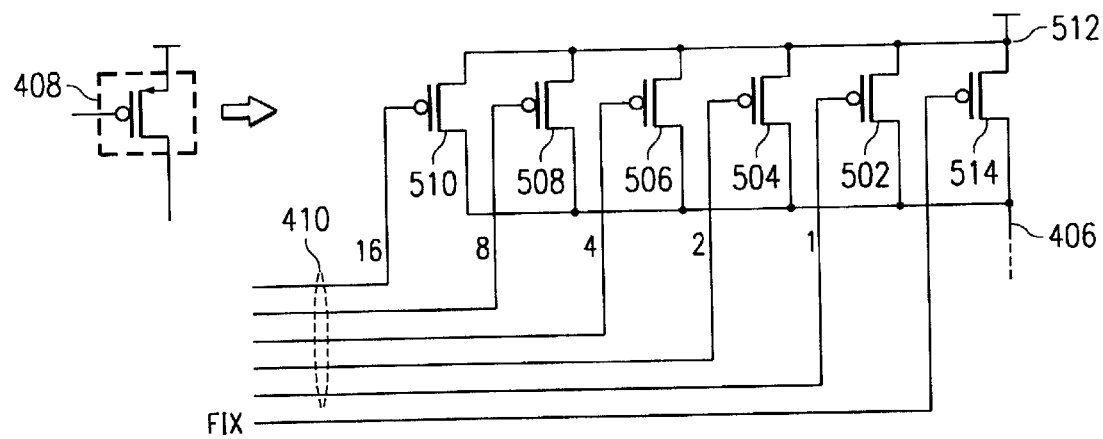
FIG. 5 illustrates a simplified schematic of the p-channel drive transmitter for the calibrated source terminations.

Referring now to FIG. 5, there is illustrated a diagrammatic view of one of the transistor structures 408, it being understood that corresponding transistor structure 412 is similar with the exception that it utilizes n-channel transistors and some ESD ballast resistors. There are provided five selectable p-channel structures 502, 504, 506, 508 and 510, each having one or more parallel connected p-channel transistors for the weighting factor thereof. Each has the source/drain path thereof connected between the $V_{dd}$ on a node 512 and the node 406. Transistor 502 is binary weighted as "1," transistor structure 504 is binary weighted for a value of "2" transistor structure 506 is binary weighted for a value of "8," transistor 508 is binary weighted for a value of "8" and transistor structure 510 is binary weighted for a value of "16," each of the transistor structures 502–510 have the gate thereof connected to a separate one of the five lines on bus 410. In addition, there is provided a fixed transistor 514, which has a binary weight of "8." The gate of transistor structure 514 is connected to a fixed signal voltage FIX. This signal provides for a finite amount of resistance to be disposed between node 512 and node 406.

In order to provide the binary weighting, as necessary to combine a multiple ones of common identical transistors together, or, alternatively, to vary the W/L ratio with the width value being increased in order to decrease the impedance of the particular transistor. Therefore, if one wanted to provide a binary weight of "16," the width would be sixteen times the width of the binary "1" weighted transistor.

Figure 6:
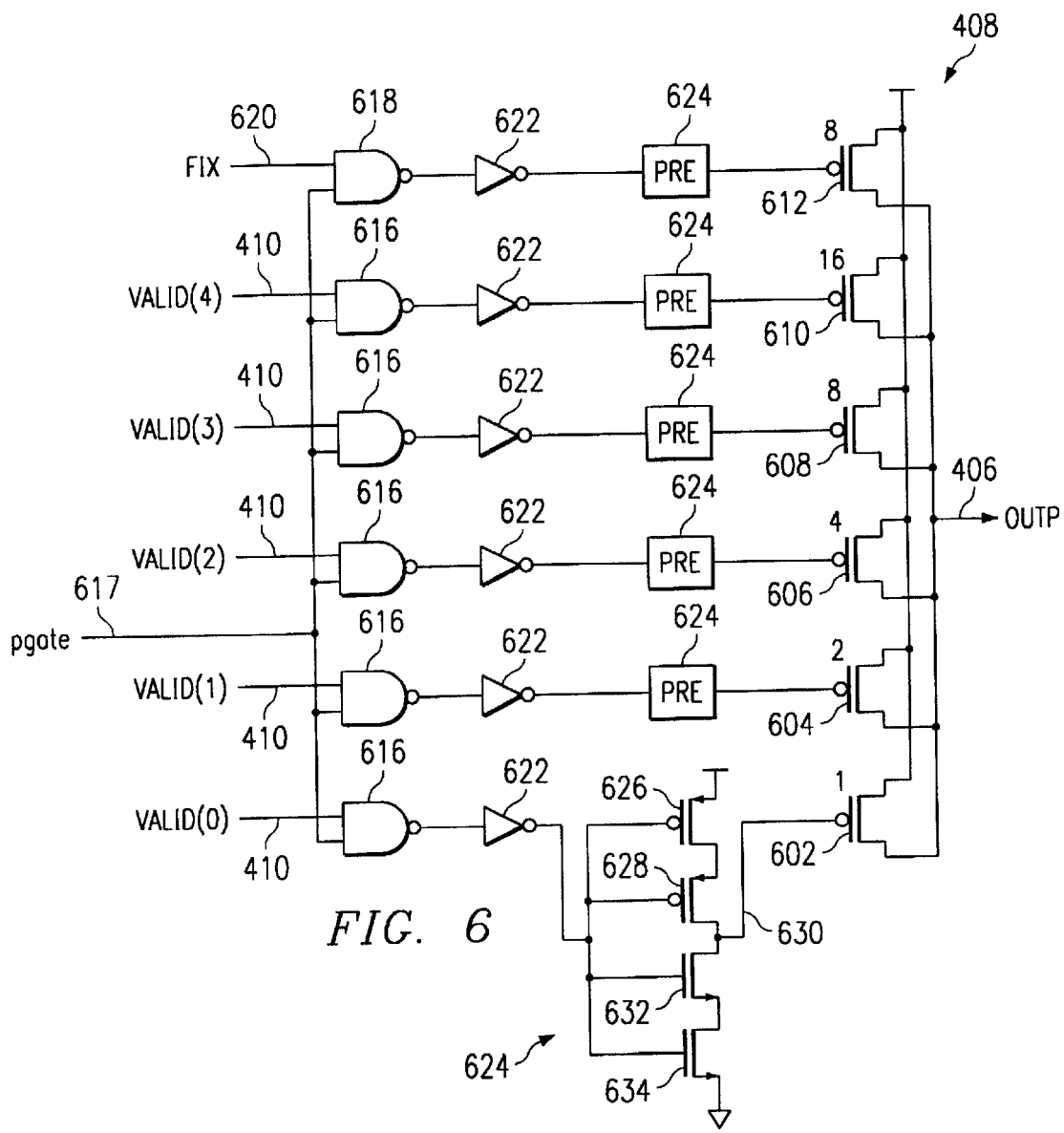
FIGS. 6 and 7 illustrate detailed schematics of the driving circuit for the p-channel and n-channel sides of the source termination.

Referring now to FIG. 6, there is illustrated a detailed diagram of the driver 416 of enable circuit 420 and the transistor structure 408. The transistor structure 408 is illustrated as being comprised of six p-channel structures, each p-channel structure comprised of one or more parallel connected transistors or transistors of differing weight. The transistor structure 408 is illustrated in this embodiment as having six transistor structures, a binary weighted "1" structure 602, a binary weighted "2" transistor structure 604, a binary weighted "4" transistor structure 606, a binary weighted "8" transistor structure 608, a binary weighted "16" transistor structure 610 and a binary weighted "8" transistor structure 612. The transistor structure 612 provides the fixed value. The bus 415 is input to a gated structure comprised of five NAND gates 616, each associated with one of the wires of the 5-bit bus 410, which associated wire is input to one input thereof. The other input thereof is connected to the data line 617 on the output of the inverter 424. A sixth NAND 618 is provided having one input thereof connected to the output of the inverter 424 on the line 617, and the other input thereof connected to the FIX signal on a line 620. Each of the NAND gates 616 and 618 have the outputs thereof connected to an associated inverter 622, the outputs of each of the inverters 622 connected to an associated preamp stage 624. Of the paths, a detailed schematic of the preamp stage is illustrated for the binary "1" weighted path, the remaining preamp stages 624 being identical. In this path, the preamp 624 is illustrated as being comprised of two series connected p-channel transistors 626 and 628 having the source/drain paths thereof connected in series between the $V_{dd}$ and a node 630. There are provided two series connected n-channel transistors 632 and 634 having the source/drain paths thereof connected in series and between node 630 and ground. The gates of all of the transistors 626, 628, 632 and 634 are connected to the output of the associated inverter 622. Node 630 is operable to drive the gate of transistor 602. Similarly, the outputs of each of the preamps 624 associated with the binary weighted "2," "4," "8," "16" and the binary weighted fixed path having the gates thereof connected to the output of the associated inverter 622 and the outputs thereof connected to the gate of the associated transistor structures 604–612. It is noted that the NAND gates 616 and 618 are binary weighted in correspondence to the transistor structures 602–612.

Figure 7:
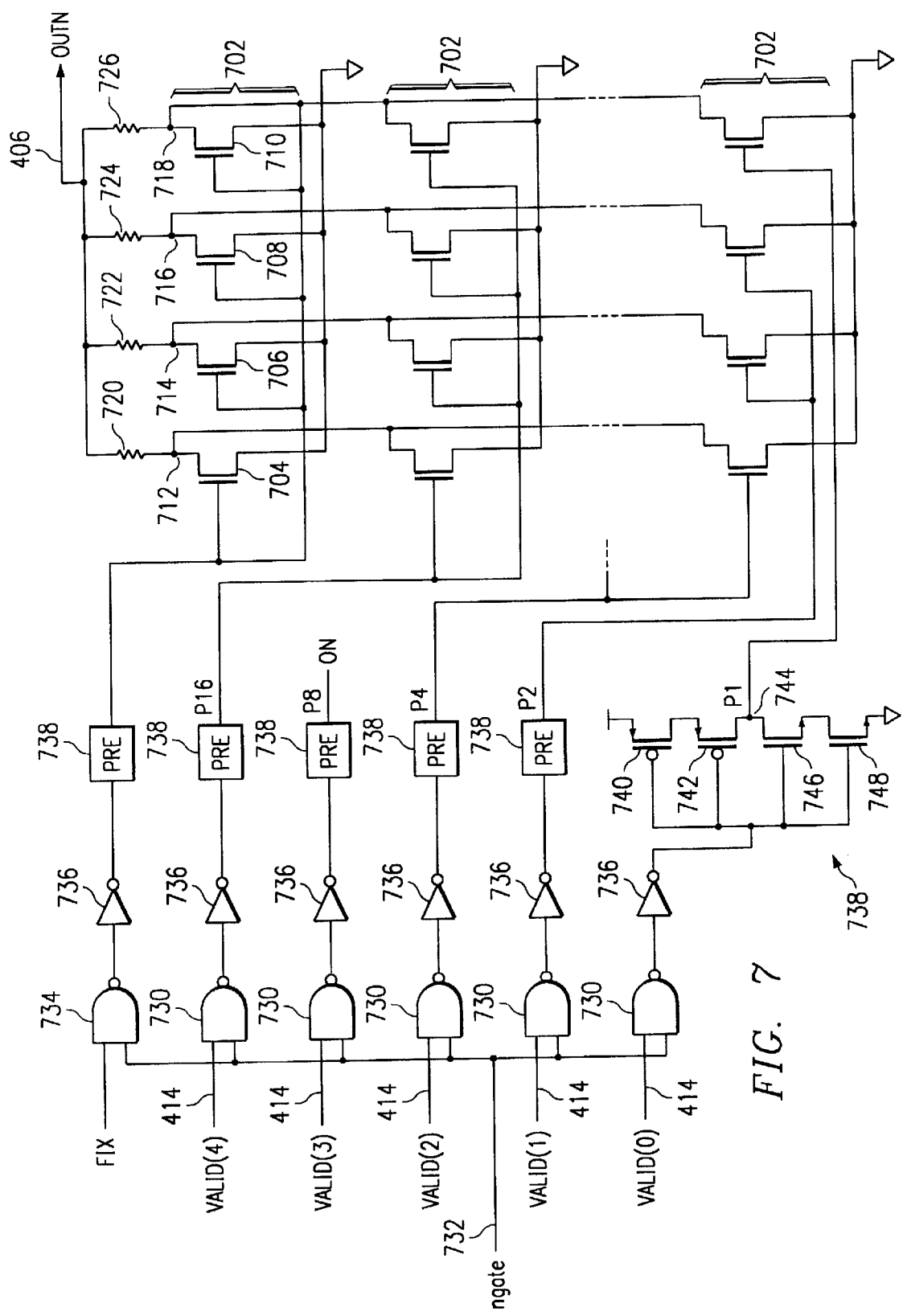

Referring now to FIG. 7, there is illustrated a detail of a portion of the n-channel enable gate 430, the inverter 426 and the n-channel transistor structure 412. In general, the transistor structure 412 is comprised of a plurality of groups of six transistor structures 702 (one of which is fixed), each comprised of four n-channel transistors 704, 706, 708 and 710, each having the source thereof connected to ground and the drain thereof connected to a separate node 712, 714, 716 and 718. Each of the nodes 712, 714, 716 and 718 are connected through respective ESD resistors 720, 722, 724 and 726 to node 406.

There are provided five NAND gates 730 for the five lines of bus 414, each having one input thereof connected to one input of the bus 414, and the other input of each of the NAND gates connected to the n-channel input signal on a line 732. This signal line 732 is connected to the output of the inverter 424. A sixth NAND gate 734 is provided, having one input thereof connected to the signal lines 732 for the data and the other input thereof connected to a FIX signal, this being the fixed value. Each of the NAND gates 730 and 734 have the outputs thereof connected to a respective inverter 736, the output of the inverter 736 each connected to an associated preamp 738. Of the preamps 738, the preamp 738 that forms the binary weighted "1" transistor structure is illustrated in detail. This preamp 738 is illustrated as having two p-channel transistors 740 and 742 having the source/drain paths thereof connected in series between $V_{dd}$ and a node 744 and two n-channel transistors 746 and 748 having the source/drain paths thereof connected in series between node 744 and ground. The gates of all transistors 740, 742, 746 and 748 are connected to the output of the associated inverter 736. Node 744 comprises the output which is connected only to a single one of the transistors in the lower group of transistor 702. It is noted that the transistors in the lower group 702 have a value of "1." Therefore, the binary weighted "2" path would have the output of the preamp 738 connected to only two of the transistors in the lower group. The binary weighted "8"path would have the output thereof connected to eight of the transistors. Some of the transistors in the group 702, for the upper groups, are sized with a two times transistor width, such that the fixed transistor structure associated with the output of the preamp 738 for the upper path is connected to four transistors, each being a two times the transistor width. This would provide a binary weight of "8."

Figure 8:
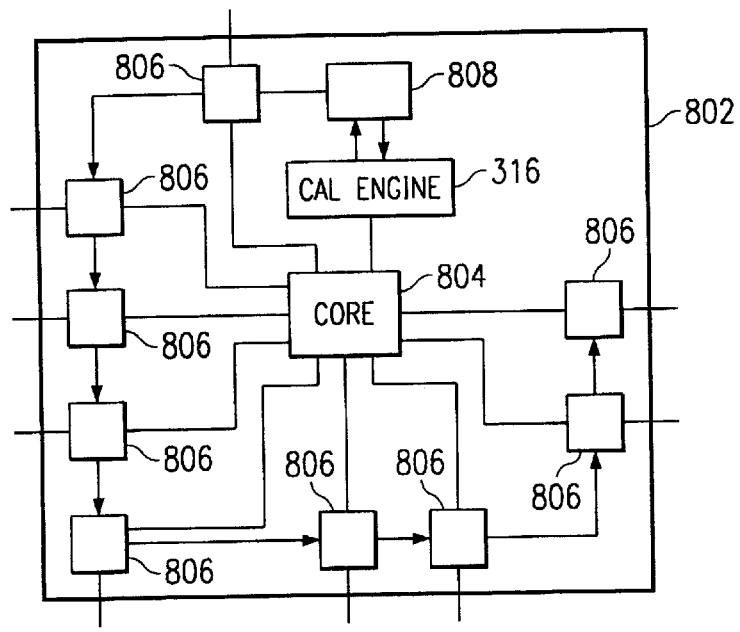
FIG. 8 illustrates a diagram of the overall chip illustrating the relationship between the calibration engine, the calibration PAD and remaining PADS.

Referring now to FIG. 8, there is illustrated a diagrammatic view of the overall integrated circuit 802 having disposed thereon the calibrated resistance PADS. There is illustrated a core circuit 804 which provides for processing, coding/decoding, etc., that would be required to effect the functionality of the integrated circuit 802. The core 804 is interfaced with a plurality of PADS 806 disposed about the periphery thereof. There is also provided a dummy PAD 808 which is interfaced with the calibration engine 316. The calibration engine 316, as will be described in more detail hereinbelow, determines what information is necessary to provide desired performance results, i.e., to provide an internal 50 ohm impedance over temperature and process variations. Once the calibration engine 316 has determined such values, these values are then output to all of the PADS 806 in a "daisy chain" manner. As such, the calibration engine 316 will provide as an output the enable signals that would be associated with the enable busses 432 and 434 to the dummy PAD 808, which would then be passed through to the next adjacent PAD 806, which adjacent PAD 806 would pass this through in a buffered manner to a next adjacent PAD 806 and so on, it being noted that this is not a continuous loop that would result in the last of the PAD 806 buffering this signal back to the dummy PAD 808.

Figure 9:
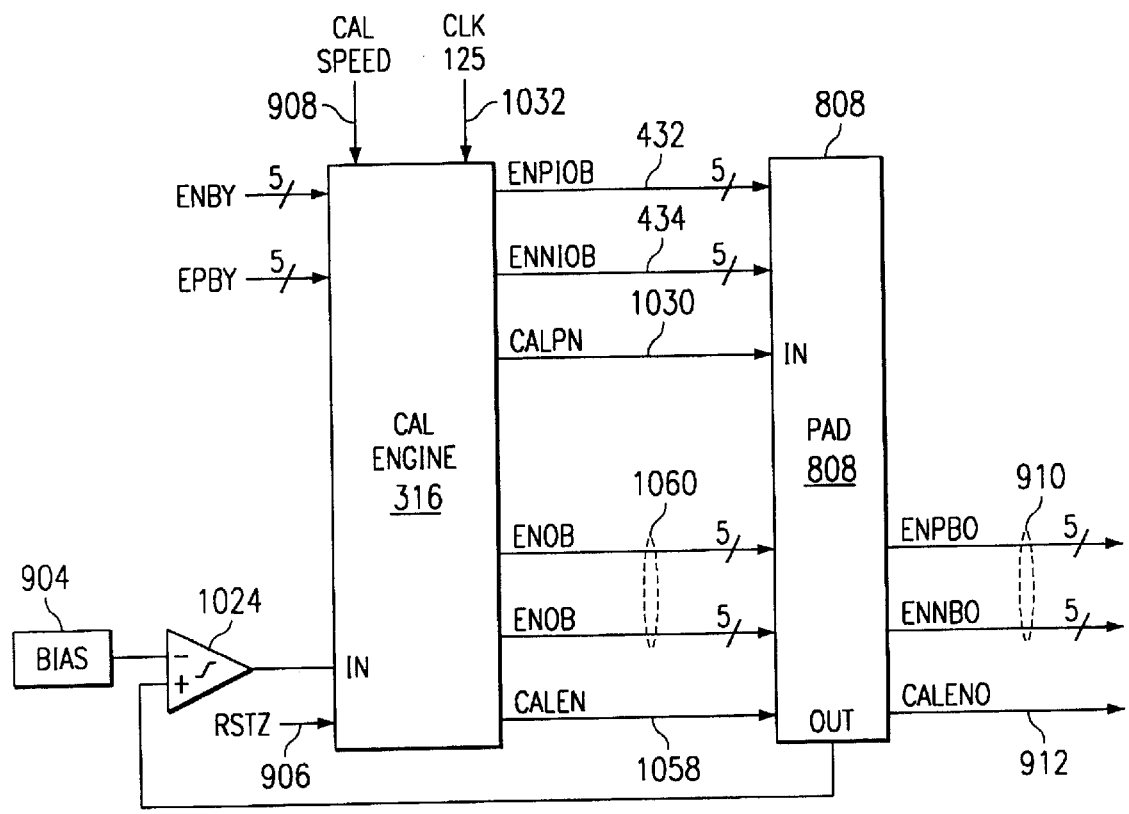
FIG. 9 illustrates a top level diagram for the calibration engine.

Referring now to FIG. 9, there is illustrated a view of the calibration engine 316 and the dummy pad 808. In general, the calibration engine 316 is operable to receive as an input the output of a comparator 1024 that is operable to receive on the positive input thereof the output signal of the dummy PAD 808 and compare it with a preamp voltage generated by bias voltage, by bias circuit 904. As will be described hereinbelow, this bias voltage is $V_{dd}/2$. The calibration engine 316 also receives a reset signal on a line 906 to initiate the operation thereof, this reset signal generated internally or generated externally. The calibration engine 316 has a calibration speed input on a line 908 which determines the speed at which the calibration will be performed and also a clock input on a line 1032. The calibration engine 316 is operable to sample the output of the comparator and determine, during calibration, the enable values for the n-enable signal and the p-enable signal along the enable buses 432 and 434. Also, an input is provided to the dummy PAD 808 in the form of a logic "1" or logic "0" on a input signal line 1030 labeled "CALPN." This is for the purpose of inputting a logic "1" or a logic "0." This information is utilized to generate the output signal, as will be described hereinbelow.

Once the calibration is completed, the calibration engine 316 will perform an update, wherein the determined p-enable and n-enable signals will be output on two buses 1060 labeled EPOB and ENOB for the p-channel and n-channel enable signals, respectively. These are passed through to two 5-bit buses 910, the buses labeled ENPBO and ENNBO. Additionally, the CALEN signal on line 1058 is buffered and output on a line 912 as a CALENO line. Each of the pads 806 has similar circuitry contained therein for buffering and passing through the received n-enable and p-enable signals on the buses 910 and the calibration enable signal. Overall, the pad circuitry associated with the dummy pad 808 is substantially identical to that in each of the PADS 806 and 808. The only difference is that the internal physical pad (not shown) is not connected to an external interface, such that it can be calibrated during the operation of the overall integrated circuit 802.

Figure 10:
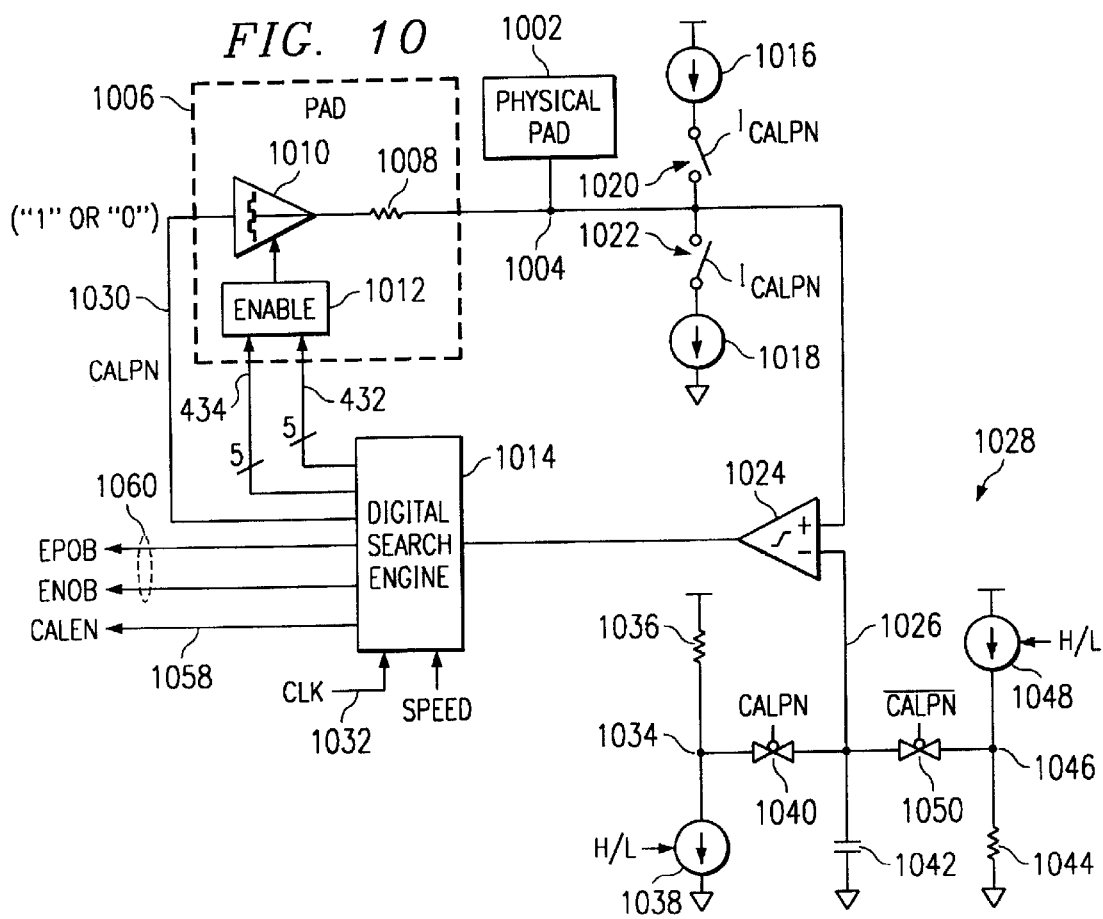
FIG. 10 illustrates a more detailed diagrammatic view of the calibration engine in association with the calibration PAD.

Referring now to FIG. 10, there is illustrated a diagrammatic view of the calibration engine 316 and the dummy PAD 808. The dummy PAD 808 includes therein a physical pad 1002. The physical pad is connected to a node 1004, which is connected to a PAD circuit 1006. The PAD circuit 1006 is identical to the PAD circuits on each of the PADS 806. This, as described hereinabove, requires a fixed polycrystalline silicon resistor 1008 connected to the output of a p-channel and n-channel driver 1010. This was described hereinabove with respect to FIG. 4. There will be provided enable data on the two n-channel and p-channel enable buses 432 and 434, which will be stored in enable storage medium 1012, which would comprise enable blocks 420 and 430. This would provide information that would be utilized to vary the resistive value internal to the driver 1010 and the associated transistor structures 408 and 412. These enable outputs are provided from a digital search engine 1014. The output of the driver 1010 is connected to the resistor 1008 to the node 1004, which is selectably connectable to a current driver 1016 to drive current from the $V_{dd}$ to the node 1004. A second current driver 1018 is provided for sinking current from the node 1004 to ground. The current source 1016 is connected through a switching circuit to node 1004 selectively by a control signal ICALN. This will drive current to the node 1004 and through the associated n-channel transistor structure 412. A second switch 1022 is provided for selectively connecting the current source 1018 to the node 1004 with a signal ICALP, this for sinking current from node 1004 through the p-channel transistor structure 408. The currents through nodes 1016 and 1018 are fixed currents that are temperature and processed invariant.

The signal on node 1004 is input to the positive input of a comparator 1024, the negative input thereof connected to a node 1026, this being set at the $V_{dd}/2$. The voltage on the node 1026 is derived from a circuit 1028, which will be described hereinbelow.

The output of the comparator 1024 is either a logic "1" or "0." This is input to the digital search engine 1014. The digital search engine 1014 determines if the output comparator 1024 is at the high or low state. Based upon the state, the enable values will be either increased or decreased. The digital search engine 1014 will output a logical "1" or "0" on a line 1030, which comprises the CALPN signal, for input to the drive circuit 1010. This is basically data input to the PAD circuit 1006. For a logic "1," this indicates the calibration portion for the p-channel transistor structure 408 and for a logic "0," this indicates the calibration operation for the n-channel transistor structure 412. The digital search engine 1014 is clocked by clock signal 1032, which operates at a frequency of 125 MHz. This, of course, is only for this disclosed embodiment, which is associated with an Ethernet controller.

During the search operation, the trip threshold voltage on the negative input of the comparator 1024 is selected from two different circuits, one for the n-channel calibration operation and one for the p-channel calibration operation. For the p-channel operation, a voltage is generated on a node 1034 by connecting a resistor 1036 between $V_{dd}$ and node 1034, and a current source 1038 between node 1034 and ground. The voltage at node 1034 is controlled to be at a predefined voltage drop from $V_{dd}$. The current source 1038 is operable to develop two currents, for two modes of operation of the integrated circuit 802. This is for two different $V_{dd}$ voltages. Although it is illustrated as a resistor, the resistor 1036 is actually a variable resistor.

During the operation wherein CALPN is high, a gate 1040 is provided for connecting node 1034 to node 1026, node 1026 also connected to ground with a capacitor 1042. During the test of the n-channel transistor structure 412, a second voltage is developed with a resistor 1044 connected between a node 1046 and ground and a current source 1048 connected between $V_{dd}$ and node 1046. This provides a predetermined voltage. Current source 1048 is also selectable between two current levels for the two different modes of operation described hereinabove with respect to current source 1038. A gate 1050 is provided for connecting node 1046 to node 1026 when CALPN is low.

In operation, the digital search engine 1014 will be initiated on a periodic basis and go through a first operation where it will test the p-channel sign of the driver 1010 by connected the current source 1024 to node 1004. This will result in the digital search engine 1014 outputting a first enable value on the bus 432 to determine the resistance of the p-channel side. The voltage will be compared to $V_{dd}/2$ at the comparator 1024 and, if it is greater, then the resistance will be increased by subtracting transistors away from the overall structure. The digital search engine 1014 operates with a predetermined search algorithm over a finite amount of time such that it will eventually settle into a value that alternates on either side of $V_{dd}/2$. At the end of this period of time, the p-channel enable signal or value will be stored and then the switch 1022 opened and switch 1020 closed to then calibrate the n-channel side. This will operate in the same manner.

After the entire search operation has been processed for both the n-channel side and the p-channel side, the digital search engine will then output the calibration enable signal CALEN on a line 1058 and provide updated p-enable and n-enable signals on two 5-bit buses 1060. The enable signals will be transmitted to each of the other PADS 806 along with the enable signal to allow the update to occur. The overall calibration operation, in one embodiment, is asynchronous with respect to the operation of the other PADS 806. It runs independent of the operation of the overall integrated circuit. Alternatively, the calibration operation could be initiated based upon some process requests from the core integrated circuit or it could be initiated upon an external command by the user.

Figure 11:
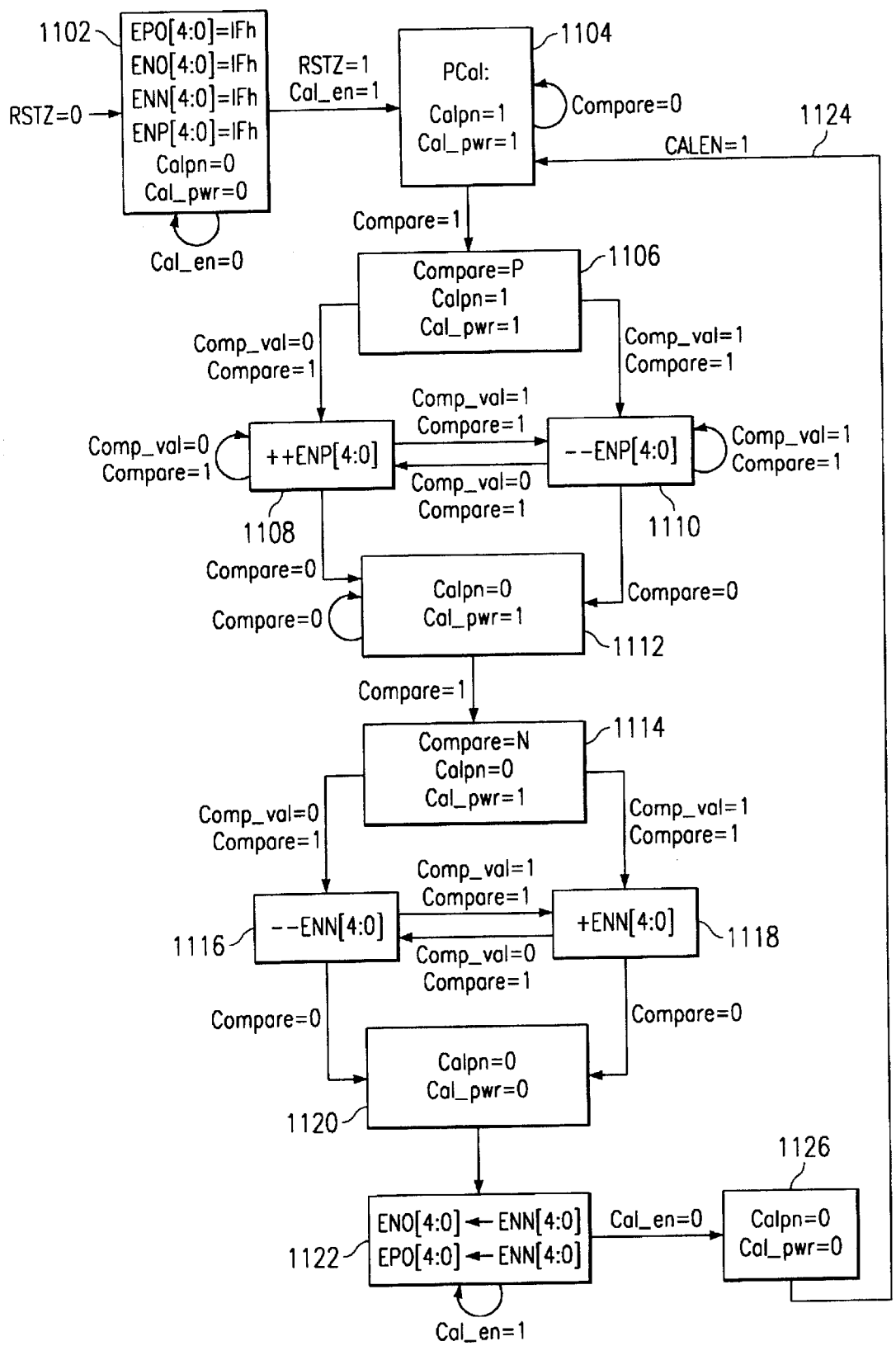
FIG. 11 illustrates a state diagram for the calibration engine.

Referring now to FIG. 11, there is illustrated a state diagram for the operation of the calibration engine 316. The state diagram is initiated at a block 1102 in response to the reset value being equal to "0" and CALEN being equal to the value of "0." When this condition exists, all of the enable values will be preset to a defined starting calibration value. There are defined two 5-bit values, EPO and ENO, which constitute the final transfer values that are in a register. There are two 5-bit values ENN and ENP which constitute the 5-bit enable values that are used during the calibration operation. It is noted that these values are incremented up from an initial value to a final value before being transferred to the EPO and ENO registers. Each of the values in the EPO, ENO, ENN and ENP registers are set to a hexadecimal value of $1f_h$. The input signal to the PAD, CALPN, is set equal to "0" and an internal power up/power down signal, CALPWR, is set equal to "0." This block 1102 will remain in a given state until all values have settled to the appropriate values and then the next state is initiated at a block 1104, wherein the reset signal is set equal to a value of "1" and the CALEN signal is set to a value of "1," indicating a test for the p-channel side. At this point, the calibration engine is powered up such that the CALPWR signal is "1" and the state will then switch to a next state, out of block 1106, to perform a COMPARE, there being a internal comparator flag set to "1" during a COMPARE operation. In block 1106, the COMPARE operation is for the p-channel device wherein the CALPN signal is set to "1" and the CALPWR signal is set to "1." There are two determinations made, whether the output of the comparator, the COMPVAL signal, is a "0" or a "1." If it is a "0," the state diagram will proceed to a block 1108 to increment the value in the ENP register. This is a cyclic operation wherein the value of ENP is incremented in accordance with a predetermined search algorithm, and then the COMPVAL value evaluated. This will continue until the COMPVAL goes to "1," at which time the state will switch to a block 1110, which is also the block that would be jumped to in a state diagram if it had been determined at block 1106 that the COMPVAL were at a value of "1." At the block 1110, the value of ENP is decremented until COMPVAL goes to a "0," at which time the state will switch to the block 1108. The operation will continue to go back and forth between blocks 1108 and 1110 until the value reaches substantially one LSB of the final settling value and will vacillate between blocks 1108 and 1110 at this point for each change. This will continue until the COMPARE signal is set equal to the value of "0" indicating a switch over to calibration of the n-channel side. The state diagram will proceed to a block 1112 to set the value of CALPN to "0" and the COMPARE signal set equal to "1." There will be a wait state approximately 325 clock cycles before moving from the block 1102. After 325 cycles, COMPARE is set equal to "1" and the state diagram proceeds to a block 1114 to perform the operation on the n-channel side. This operates similar to the p-channel side in that the flow will be to either a block 1116 for a COMPVAL "0" or to a block 1118 for a COMPVAL of "1." At the block 1116, the ENN value will be decremented and, at the block 1118, the ENN value will be incremented. Whenever COMPVAL changes state, operation will be transferred from block 1116 to 1118 or the reverse. After a predetermined amount of time, the COMPARE signal is set to "0" and the operation will be completed and the state diagram will flow to a block 1120 to then terminate the operation and then store the values in ENN and ENP to the ENO and EPO registers, in a block 1122. At this point, the CALEN signal is set equal to a "1" and then it is changed to a "0," indicating that an update procedure can occur. Once the update signal has been set, then the next calibration cycle will be initiated along a line 1124, indicated by block 1126 wherein the calibration engine is again powered up and another calibration cycle is initiated. In this manner, the calibration can be performed and then the calibration values transferred to a calibration update block, at block 1126.

Figure 12:
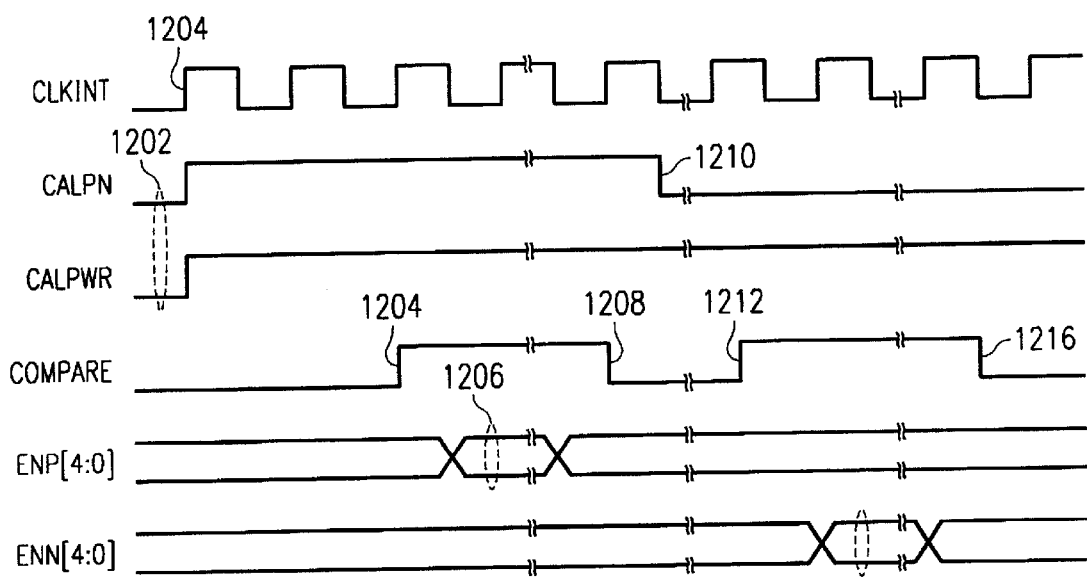
FIG. 12 illustrates a timing diagram of the calibration engine.

Referring now to FIG. 12, there is illustrated a timing diagram for the calibration operation. It can be seen that the power up operation and the CALPN signal are both raised high at two edges 1202. These are all synchronized with a clock 1204 which is an internal clock. Again, as noted hereinabove, this operation is asynchronous with the operation of the rest of the chip. At a later time, after CALPWR and CALPN are raised high, the COMPARE signal will go high at an edge 1204 to initiate the overall process. During this time, the ENP values are changed, indicated by data transitions 1206. When a predetermined number of clocks has occurred, providing sufficient time for the overall calibration operation, the COMPARE signal will be pulled low at an edge 1208 for 325 clock cycles and then, during this time, the CALPN signal will be switched/changed to a logic "0" at a falling edge 1210. The COMPARE signals will then go high again at an edge 1212 (after 325 clock cycles) and then the ENN signal values will be changed, as indicated by data transitions 1214. This, again, will continue for a predetermined amount of time until a falling edge 1216 on COMPARE, after which an update operation is performed.

Figure 13:
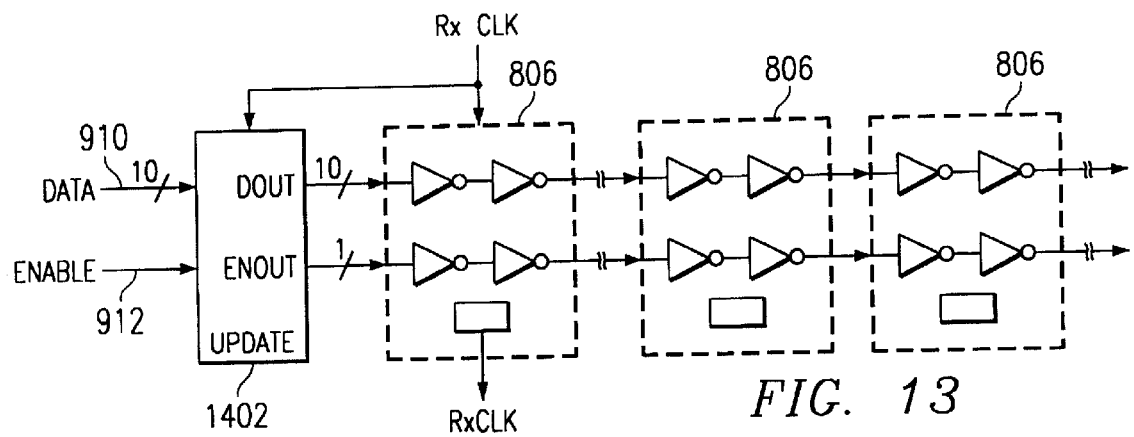
FIG. 13 illustrates a diagrammatic view for the PAD update operation.

Referring now to FIG. 13, there is illustrated diagrammatic view of the update operation. The data in the form of the two 5-bit buses on the output 910 will be input, along with the calibration enable signal, to an update block 1402. The update block 1402 is operable to latch the data values on the bus 910 and then provide them to each of the pads 806. Each of the 5-bit data buses on the data bus 910 are buffered at each of the PADS 806 and then passed on to the next one. Additionally, the enable signal is also passed through each of the pads 806.

Figure 14:
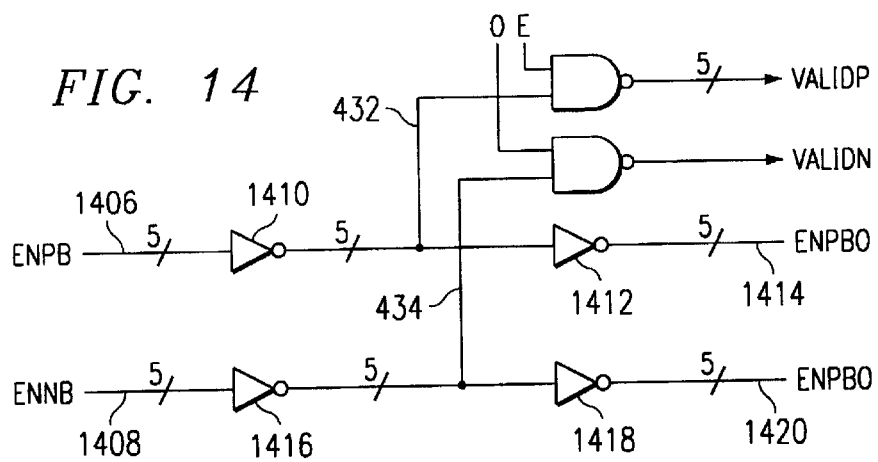
FIG. 14 illustrates the interface between the buffers in each of the PADS and the calibration circuitry.

Referring now to FIG. 14, there is illustrated a detail of the buffering operation. Each of the inputs are provided to the input of the PAD on two 5-bit buses 1406 for the p-channel label ENPB and a bus 1408, labeled ENNB. The bus 1406 is passed through an inverted buffer 1410 to interface with the bus 432 and in through a buffer 1412 to provide a 5-bit output on a bus 1414. Similarly, the ENNB signal on the bus 1408 is buffered by an inverter 1416, the output thereof connected to the 5-bit bus 434 for the n-enable signal. The output of inverter 1416 is buffered by an inverter 1418 to provide a 5-bit output on an output bus 1420 labeled ENPBO.

Figure 15:
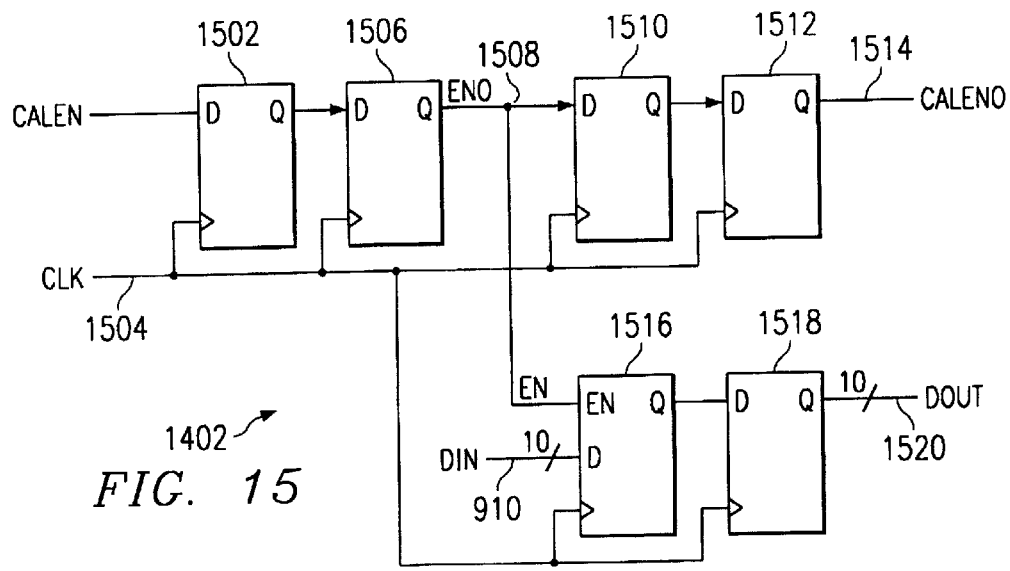
FIG. 15 illustrates a diagram of the update block.

Referring now to FIG. 15, there is illustrated a more detailed diagram of the update block 1402. The calibration enable signal is input to a first flip flop 1502, which is clocked by the internal clock signal on a clock 1504. The output of flip flop 1502 is input to a flip flop 1506, the output provided on a node 1508 labeled ENO. This output is buffered through two additional flip flops 1510 and 1512 to provide the CALENO signal on an output 1514. Therefore, it will take four clock cycles for the CALEN signal to propagate through the flip flop 1502, 1506, 1510 and 1512. After two clock cycles, the signal on the output of flip flop 1506 at node 1508 is utilized as an enable signal for flip flop 1516, the data input thereof connected to the 10-bit data bus signal 910. The clock signal will then clock through the data to the input of a second flip flop 1518, the output thereof clocked one clock cycle later to provide data output on an output 1520 for input to the next PAD 806. Once CALEN goes low, then this will be clocked through in two clock cycles to node 1508 to disable the flip flop 1516 and thereby latch this data value for the previous data value onto the flip flop 1518 until CALEN once again goes high.

Figure 16:
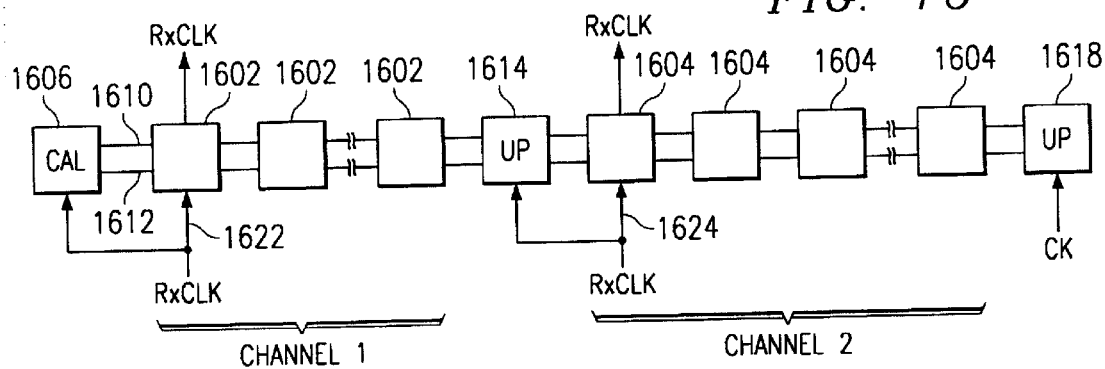
FIG. 16 illustrates a diagrammatic view of plurality of calibrated PADs for multiple channels.

Referring now to FIG. 16, there is illustrated a diagrammatic view of a sequence of PADs illustrating the propagation of the data updates thereto. The PADs are grouped in a number of groups referred to as channels, there being illustrated two channels, CH1 and CH2. In CH1, there are provided a plurality of PADs 1602 and in CH2, there are provided a plurality of PADs 1604, all arranged in a serial manner. Data is initially generated at a calibration circuit 1606, similar to the calibration circuit 316 of FIG. 9 which is operable to generate update data on a line 1610 and a calibration enable signal on a line 1612. The data on the line 1610 is propagated through all of the PADs 1602 and 1604 with an update block 1614 disposed between the last of the PAD 1602 and the first of the PAD 1604 and an update block 1618 disposed after the last of the PADs 1604.

In each of the channels, the first PAD 1602 is associated with a receive clock on a line 1622 for the PAD 1602 and a receive clock on a line 1624 for CH2 in the first of the PADs 1604. Therefore, there will be a receive clock output from the circuit for each of the channels. The receive clock for each of the channels will be utilized to clock through the enable signal from the previous block, via an update block or the calibration engine 1606. As such, the update information is generated asynchronously and the actual update, i.e., transfer of the data to the output of the update block, is synchronous with the receive data clock.

Figure 17:
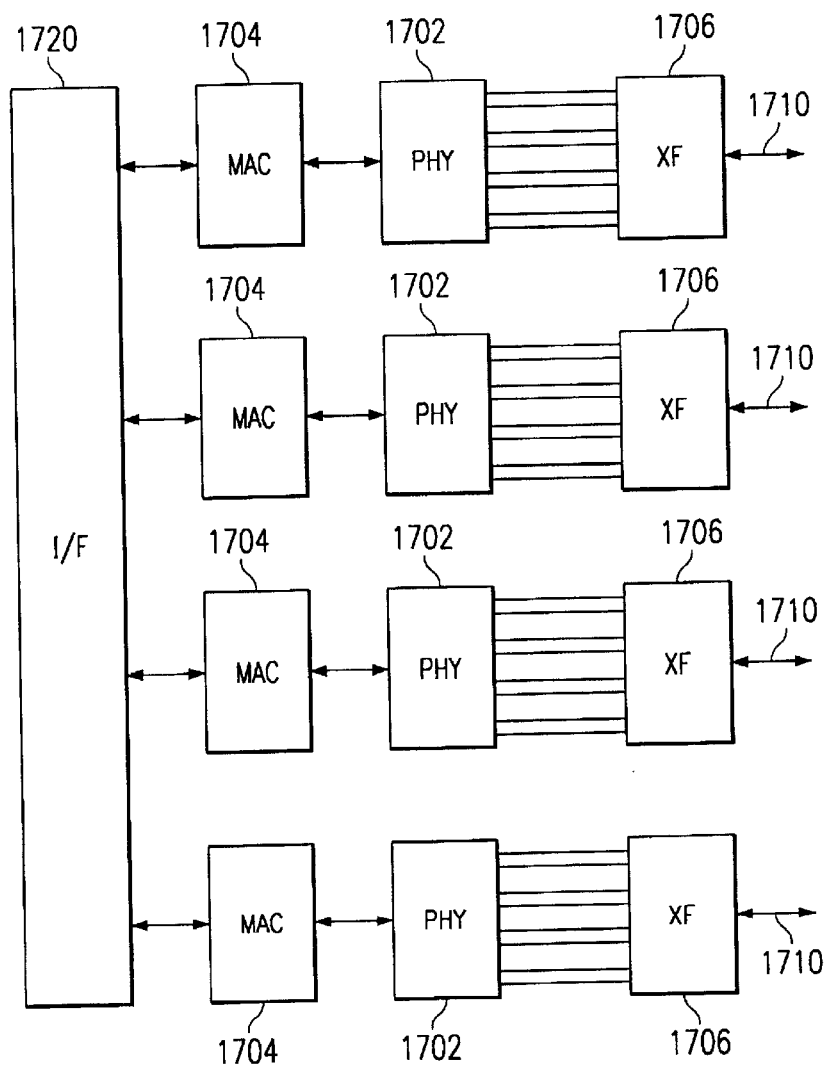
FIG. 17 illustrates an application of the Ethernet controller in a switch.

Referring now to FIG. 17, there is illustrated a diagrammatic view of an application of the Ethernet controller for a multiport switch, only four ports being illustrated. Each of the ports includes a PHY device 1702 and a MAC device 1704. The PHY device 1704 is interfaced on the network side through a transformer 1706 to a twisted wire pair cable 1710. Each of the channels has this configuration, with the transformer, PHY 1702 and cable 1710 all providing four twisted wire pairs, one for each channel of the port. This facilitates the 1000BT communication link, as described hereinabove. Each of the MACs 1704 for each of the ports has the non-PHY side thereof interfaced to an interconnection network 1720. This basically interconnects all of the MACs 1704 together, such that information can be processed from one port to the next. This is a conventional switching technology. However, it can be seen that, since there are four channels for each port that there will be a large number of data connections between each of the PHYs 1702 and the MACs 1704. With all of these interconnections, a series connected resistor for each transmission line between each MAC 1704 and PHY 1702 will considerably increase the board space required for the layout. With an internal resistor on the PHY 1702 and/or the MAC 1704, this will significantly reduce the board layout space.

Although the preferred embodiment has been described in detail, it should be understood that various changes, substitutions and alterations can be made therein without departing from the spirit and scope of the invention as defined by the appended claims.

What is claimed is:

1. An integrated circuit with an impedance terminated output terminal, which integrated circuit operates in association with external digital signals having data transitions that occur on a periodic basis at an external data clock rate, comprising:

a source for sourcing current to the output terminal of the integrated circuit, which output terminal interfaces with a load having a finite impedance associated therewith, and an on-chip source impedance disposed internal to the integrated circuit and between said source and the output terminal to define the source impedance of the output terminal;

wherein said on-chip source impedance has a value that is variable, with the value thereof set by a control signal;

a control signal generator for generating said control signal to set the value of said on-chip source impedance, the operation of setting the value of said on-chip source impedance parameterized by the data transitions.

2. The integrated circuit of claim 1, wherein the on-chip source impedance has a value that impedance matches the source impedance of the output terminal to the load.

3. The integrated circuit of claim 1, wherein said control signal comprises a digital value stored in an output terminal register.

4. The integrated circuit of claim 3, wherein said control signal generator comprises a calibration circuit for defining the digital value in said output terminal register.

5. The integrated circuit of claim 4, wherein said on-chip source impedance is temperature and process dependant and said calibration circuit is operable to change said stored digital value to compensate for temperature and process variations.

6. The integrated circuit of claim 4, wherein said calibration circuit comprises:
an on-chip calibration terminal;
an on-chip calibration impedance substantially identical to said on-chip source impedance and disposed internal to the integrated circuit and between the source and the calibration terminal, the value thereof defined by a digital control signal stored in a calibration register;
a current device for defining a predetermined current through said on-chip calibration impedance;
an impedance varying device for varying the value of said digital control signal stored in said calibration register to obtain a predetermined voltage across said on-chip calibration impedance; and
said an update device for transferring the content of said calibration register to said output terminal register, which transfer operation is parameterized by the data transitions.

7. The integrated circuit of claim 6, wherein said impedance varying device operates on a periodic basis.

8. The integrated circuit of claim 6, wherein said on-chip source impedance is temperature and process dependant and said predetermined current through said on-chip calibration impedance is substantially temperature and process independent.

9. The integrated circuit of claim 1, wherein said on-chip impedance comprises a switchable impedance that is operable to be selectably disposed between the output terminal and said source only in the presence of an input signal.

10. The integrated circuit of claim 9, wherein said input signal comprises a digital signal having first and second logic states, and said switchable impedance is operable to be selectably disposed between the output terminal and said source only in the presence of one of said first and second logic states of said input signal.

11. The integrated circuit of claim 10, wherein said input signal switches between said input signal at a high frequency and said switchable impedance is operable to switch at said high frequency and said load comprises a transmission line of a finite impedance at the high frequency.

12. The integrated circuit of claim 9, wherein the on-chip impedance comprises:
a fixed on-chip impedance internal to the integrated circuit;
a switchable impedance connected in series with said fixed on-chip impedance, said combined switchable impedance and said fixed on-chip impedance disposed between said source and the output terminal, said switchable impedance operable to be selectably disposed between the said source and said fixed on-chip impedance only in the presence of an input signal.

13. The integrated circuit of claim 12, wherein said switchable impedance comprises a transistor connected between said source and said fixed on-chip impedance, with a defined transconductance associated therewith and conducting only in the presence of said input signal.

14. The integrated circuit of claim 1, wherein the voltage on the output terminal is approximately one half of the voltage level of said source when the output terminal is connected to said load.

15. An integrated circuit with an impedance terminated output terminal, which integrated circuit operates in association with external digital signals having data transitions that occur on a periodic basis at an external data clock rate, comprising:
a source for sourcing current to the output terminal of the integrated circuit and a sink for sinking current from the output terminal, which output terminal interfaces with a load having a finite impedance associated therewith;
an input signal having first and second logic states; and
an on-chip source impedance disposed internal to the integrated circuit and switchable between said source and the output terminal in the presence of said first logic state of said input signal to define the source impedance of the output terminal in the presence of said first logic state of said input signal, and between said sink and the output terminal in the presence of said second logic state of said input signal to define the source impedance of the output terminal in the presence of said second logic state of said input signal
wherein said on-chip source impedance has a value that is variable, with the value thereof set by a control signal;
a control signal generator for generating said control signal to set the value of said on-chip source impedance, the operation of setting the value of said on-chip source impedance parameterized by the data transitions.

16. The integrated circuit of claim 15, wherein the on-chip source impedance has a value that impedance matches the source impedance of the output terminal in the presence of either said first or second logic states of said input signal.

17. The integrated circuit of claim 15, wherein said on-chip source impedance comprises a first on-chip source impedance and a second on-chip source impedance, said first on-chip source impedance switchable between said source and the output terminal in the presence of said first logic state of said input signal to define the source impedance of the output terminal in the presence of said first logic state of said input signal, and said second on-chip source impedance switchable between said sink and the output terminal in the presence of said second logic state of said input signal to define the source impedance of the output terminal in the presence of said second logic state of said input signal.

18. The integrated circuit of claim 17, wherein said control signal comprises a first digital value stored in a first output terminal register to define the value of said first on-chip source impedance and a second digital value stored in a second output terminal register to define the value of said second on-chip source impedance.

19. The integrated circuit of claim 18 wherein said control signal generator comprises a calibration circuit for defining the first and second digital values stored in said first and second output terminal registers, respectively.

20. The integrated circuit of claim 19, wherein said first and second on-chip source impedances are temperature and process dependant and said calibration circuit is operable to change said stored first and second digital values to compensate for temperature and process variations.

21. The integrated circuit of claim 19, wherein said calibration circuit comprises:
an on-chip calibration terminal;
first and second an on-chip calibration impedances substantially identical to said first and second on-chip source impedances, respectively, and disposed internal to the integrated circuit, said first on-chip calibration resistance switchable between said source and said calibration terminal in the presence of a first calibration control signal, the value of said first on-chip calibration resistance defined by a first digital control signal stored in a first calibration register, and said second on-chip calibration resistance switchable between said sink and said calibration terminal in the presence of a second calibration control signal, the value of said second on-chip calibration resistance defined by a second digital control signal stored in a second calibration register;

a current device for defining a predetermined current through said first and second on-chip calibration impedances in the presence of the respective one of said first and second calibration control signals;

an impedance varying device for varying the value of said first and second digital control signals stored in said first and second calibration registers to obtain a predetermined voltage across said first and second on-chip calibration impedances; and an update device for transferring the content of said first and second calibration registers to the respective one of said first and second said output terminal registers, the transfer operation parameterized on the data transitions.

22. The integrated circuit of claim 21, wherein said impedance varying device operates on a periodic basis.

23. The integrated circuit of claim 21, wherein each of said first and second on-chip source impedances are temperature and process dependant and said predetermined current through each of said first and second on-chip calibration impedances is substantially temperature and process independent.

24. The integrated circuit of claim 15, wherein said input signal switches between said first and second logic states at high frequency and said switchable impedance is operable to switch at said high frequency, and said load comprises a transmission line of a finite impedance at the high frequency.

25. The integrated circuit of claim 15, wherein said first and second on-chip chip impedances comprise:

a fixed on-chip impedance internal to the integrated circuit;

a first switchable impedance connected in series with said fixed on-chip impedance, said combined first switchable impedance and said fixed on-chip impedance disposed between said source and the output terminal, said first switchable impedance operable to be selectably disposed between the said source and said fixed on-chip impedance only in the presence of said first logic state of said input signal;

a second switchable impedance connected in series with said fixed on-chip impedance, said combined second switchable impedance and said fixed on-chip impedance disposed between said sink and the output terminal, said second switchable impedance operable to be selectably disposed between the said sink and said fixed on-chip impedance only in the presence of said second logic state of said input signal.

26. The integrated circuit of claim 25, wherein said first switchable impedance comprises:

a first transistor of a first conductivity type connected between said source and said fixed on-chip impedance, with a defined transconductance associated therewith and conducting only in the presence of said first logic sate of said input signal; and a second transistor of a second conductivity type opposite said first conductivity type connected between said sink and said fixed on-chip impedance, with a defined transconductance associated therewith and conducting only in the presence of said second logic state of said input signal.

27. The integrated circuit of claim 15, wherein the voltage on the output terminal is approximately one half of the voltage level of said source when the output terminal is connected to said load in the presence of either said first or second logic states.

28. An integrated circuit with an output terminal having a calibrated source impedance comprising an on-chip impedance with a value that is fixed to substantially equal an expected finite load impedance, which said on-chip impedance defines the source impedance to the integrated circuit at the output terminal.

29. An integrated circuit that operates in association with external data transitions having data transitions that occur on a periodic basis at an external data clock rate, and has at least one output terminal having a calibrated source impedance comprising an on-chip impedance with a value that is fixed to substantially equal an expected finite load impedance, which said on-chip impedance defines the source impedance to the integrated circuit at the output terminal, and which calibrated source impedance is operable to be updated, which update operation is parameterized on the data transitions.

30. The integrated circuit of claim 29, wherein said output signal switches between at high frequency and said switchable impedance is operable to switch at said high frequency, and said load impedance comprises a transmission line of a finite impedance at the high frequency.

31. The integrated circuit of claim 30, wherein the integrated circuit comprises a network controller and the output terminal operates at a data rate as high as 1000 Megabits per second.

32. An integrated circuit operating in association with external data transitions having data transitions that occur on a periodic basis at an external data clock rate and with a plurality of calibrated impedance terminated output terminals for transmitting data at a defined rate, comprising:

an on-chip source impedance associated with each of the output terminals and each disposed internal to the integrated circuit to define the input impedance thereof;

each of said on-chip source impedances variable in response to an associated control signal; and a calibration circuit for determining the value of said control signal for each of said on-chip source impedances, thereby defining the value of each of said on-chip source impedances in accordance with the calibration of said on-chip source impedances to calibrate for predetermined characteristics thereof, which calibration circuit operates to determine the value of the control signal and then apply it to the associated one of the on-chip source impedances, which operation of applying is parameterized on the data transitions.

33. The integrated circuit of claim 32, wherein said calibration circuit operates on a periodic basis.

34. An integrated circuit operating in association with external data transitions having data transitions that occur on a periodic basis at an external data clock rate and with a plurality of calibrated impedance terminated output terminals for transmitting data at a defined rate, comprising:

an on-chip source impedance associated with each of the output terminals and each disposed internal to the integrated circuit to define the input impedance thereof, each of said on-chip source impedances variable in response to an associated control signal; and a calibration circuit for determining the value of said control signal for each of said on-chip source impedances, thereby defining the value of each of said on-chip source impedances in accordance with the calibration of said on-chip source impedances to calibrate for predetermined characteristics thereof, which calibration circuit operates to determine the value of the control signal and then apply it to the associated one of the on-chip source impedances, which operation of applying is parameterized on the data transitions;

an update register for storing said control signal for at least a group of said on-chip source impedances each having a common value that defines the value thereof as a group for each of said on-chip source impedances therein, and wherein said calibration circuit first determines said control signal for said group and then transfers the determined control signal for said group to said update register in the operation of applying.

35. The integrated circuit of claim 34, wherein said calibration circuit determines said value asynchronous with respect to the data rate, and wherein said transfer operation is synchronous with the data rate.

36. The integrated circuit of claim 34, wherein ones of said on-chip source impedances are divided into discrete groups, each of said groups having an update register associated therewith for storing therein said associated control signal, said calibration circuit first determining said control signals for each of said groups and then transferring the determined control signals for each of said groups to said associated update registers.

37. The integrated circuit of claim 36, wherein all of said control signals for all of said groups are the same.

38. The integrated circuit of claim 37, wherein said update registers are daisy chained, such that said control signals are transferred to a given one of said update registers subsequent to transfer to the subsequent one of said update registers from the given one of said update registers.

39. The integrated circuit of claim 38, wherein said calibration circuit determines said value asynchronous with respect to the data rate, and wherein said transfer to each of said update registers is synchronous with the data rate.

40. An assembly on a support member, comprising:
a first integrated circuit that operates in association with external data transitions having data transitions that occur on a periodic basis at an external data clock rate, and has at least one signal output, said at least first integrated circuit disposed proximate to the substrate and for providing an output signal on said signal output;
a second integrated circuit disposed on the support member and having a signal input for receiving an input signal;
a transmission line disposed between said signal output of said first integrated circuit and said signal input of said second integrated circuit, such that the combination of said transmission line and said signal input of said second integrated circuit presents a terminating impedance to said signal output of said first integrated circuit; and
an impedance matching device disposed on said first integrated circuit for impedance matching said signal output of said first integrated circuit to said terminating impedance, and which impedance matching device is operable to be updated, which update operation is parameterized on the data transitions.

41. The assembly of claim 40, wherein the impedance of said signal input of said second integrated circuit is substantially lower than said terminating impedance.

42. The assembly of claim 41, wherein the impedance of said signal input of said second integrated circuit is a capacitive termination.

43. The assembly of claim 41, wherein said terminating impedance is approximately equal to the impedance of said transmission line.

44. The assembly of claim 40, wherein said first integrated circuit has a driver associated with said signal output and said impedance matching device is operable to impedance match the output impedance of said driver to said terminating impedance.

45. A method for impedance terminating an output terminal on an integrated circuit, which integrated circuit operates in association with external digital signals having data transitions that occur on a periodic basis at an external data clock rate, comprising the steps of:
sourcing current with a source to the output terminal of the integrated circuit, which output terminal interfaces with a load having a finite impedance associated therewith, and
disposing an on-chip source impedance internal to the integrated circuit and between the source and the output terminal to define the source impedance of the output terminal;
wherein the on-chip source impedance has a value that is variable, with the value thereof set by a control signal;
generating with a control signal generator the control signal to set the value of the on-chip source impedance, the operation of setting the value of the on-chip source impedance parameterized by the data transitions.

46. The method of claim 45, wherein the on-chip source impedance has a value that impedance matches the source impedance of the output terminal to the load.

47. The method of claim 45, wherein the control signal comprises a digital value stored in an output terminal register.

48. The method of claim 47, wherein the step of generating comprises the step of defining the digital value in the output terminal register in a calibration operation with a calibration circuit.

49. The method of claim 48, wherein the on-chip source impedance is temperature and process dependant and the step of defining with the calibration circuit is operable to change the stored digital value to compensate for temperature and process variations.

50. The method of claim 48, wherein the step of defining with the calibration circuit comprises the steps of:
providing an on-chip calibration terminal;
disposing an on-chip calibration impedance substantially identical to the on-chip source impedance internal to the integrated circuit between the source and the calibration terminal, the value thereof defined by a digital control signal stored in a calibration register;
defining a predetermined current through the on-chip calibration impedance with a current device;
varying the value of the digital control signal stored in the calibration register with an impedance varying device to obtain a predetermined voltage across the on-chip calibration impedance; and
transferring the content of the calibration register to the output terminal register with an update device, which transfer operation is parameterized by the data transitions.

51. The method of claim 50, wherein the impedance varying device operates on a periodic basis.

52. The method of claim 50, wherein the on-chip source impedance is temperature and process dependant and the predetermined current through the on-chip calibration impedance is substantially temperature and process independent.

53. The method of claim 45, wherein the on-chip impedance comprises a switchable impedance that is operable to be selectably disposed between the output terminal and the source only in the presence of an input signal.

54. The method of claim 53, wherein the input signal comprises a digital signal having first and second logic states, and the switchable impedance is operable to be selectably disposed between the output terminal and the source only in the presence of one of the first and second logic states of the input signal.

55. The method of claim 54, wherein the input signal switches between the input signal at a high frequency and the switchable impedance is operable to switch at the high frequency and the load comprises a transmission line of a finite impedance at the high frequency.

56. The method of claim 53, wherein the on-chip impedance comprises:
  a fixed on-chip impedance internal to the integrated circuit;
  a switchable impedance connected in series with the fixed on-chip impedance, the combined switchable impedance and the fixed on-chip impedance disposed between the source and the output terminal, the switchable impedance operable to be selectably disposed between the source and the fixed on-chip impedance only in the presence of an input signal.

57. The method of claim 56, wherein the switchable impedance comprises a transistor connected between the source and the fixed on-chip impedance, with a defined transconductance associated therewith and conducting only in the presence of the input signal.

58. The method of claim 45, wherein the voltage on the output terminal is approximately one half of the voltage level of the source when the output terminal is connected to the load.

59. An method for impedance terminating an output terminal of an integrated circuit, which integrated circuit operates in association with external digital signals having data transitions that occur on a periodic basis at an external data clock rate, comprising the steps of:
  sourcing current with a source to the output terminal of the integrated circuit and sinking current from the output terminal with a sink, which output terminal interfaces with a load having a finite impedance associated therewith;
  providing an input signal having first and second logic states; and
  disposing an on-chip source impedance internal to the integrated circuit and switchable between the source and the output terminal in the presence of the first logic state of the input signal to define the source impedance of the output terminal in the presence of the first logic state of the input signal, and between the sink and the output terminal in the presence of the second logic state of the input signal to define the source impedance of the output terminal in the presence of the second logic state of the input signal
  wherein the on-chip source impedance has a value that is variable, with the value thereof set by a control signal;
  generating with a control signal generator the control signal to set the value of the on-chip source impedance, the operation of setting the value of the on-chip source impedance parameterized by the data transitions.

60. The method of claim 59, wherein the on-chip source impedance has a value that impedance matches the source impedance of the output terminal in the presence of either the first or second logic states of the input signal.

61. The method of claim 59, wherein the on-chip source impedance comprises a first on-chip source impedance and a second on-chip source impedance, the first on-chip source impedance switchable between the source and the output terminal in the presence of the first logic state of the input signal to define the source impedance of the output terminal in the presence of the first logic state of the input signal, and the second on-chip source impedance switchable between the sink and the output terminal in the presence of the second logic state of the input signal to define the source impedance of the output terminal in the presence of the second logic state of the input signal.

62. The method of claim 61, wherein the control signal comprises a first digital value stored in a first output terminal register to define the value of the first on-chip source impedance and a second digital value stored in a second output terminal register to define the value of the second on-chip source impedance.

63. The method of claim 62 wherein the step of generating comprises the step of defining the first and second digital values stored in the first and second output terminal registers, respectively, in a calibration step with a calibration circuit.

64. The method of claim 63, wherein the first and second on-chip source impedances are temperature and process dependant and the calibration circuit is operable to change the stored first and second digital values to compensate for temperature and process variations.

65. The method of claim 63, wherein the step for defining with the calibration circuit comprises the steps of:
  providing an on-chip calibration terminal;
  disposing internal to the integrated circuit first and second an on-chip calibration impedances substantially identical to the first and second on-chip source impedances, respectively, the first on-chip calibration resistance switchable between the source and the calibration terminal in the presence of a first calibration control signal, the value of the first on-chip calibration resistance defined by a first digital control signal stored in a first calibration register, and the second on-chip calibration resistance switchable between the sink and the calibration terminal in the presence of a second calibration control signal, the value of the second on-chip calibration resistance defined by a second digital control signal stored in a second calibration register;
  defining with a current device a predetermined current through the first and second on-chip calibration impedances in the presence of the respective one of the first and second calibration control signals;
  varying with an impedance varying device the value of the first and second digital control signals stored in the first and second calibration registers to obtain a predetermined voltage across the first and second on-chip calibration impedances; and
  transferring with an update device the content of the first and second calibration registers to the respective one of the first and second the output terminal registers, the transfer operation parameterized on the data transitions.

66. The method of claim 65, wherein the impedance varying device operates on a periodic basis.

67. The method of claim 65, wherein each of the first and second on-chip source impedances are temperature and process dependant and the predetermined current through each of the first and second on-chip calibration impedances is substantially temperature and process independent.

68. The method of claim 59, wherein the input signal switches between the first and second logic states at high frequency and the switchable impedance is operable to switch at the high frequency, and the load comprises a transmission line of a finite impedance at the high frequency.

69. The method of claim 59, wherein the first and second on-chip impedances comprise:
a fixed on-chip impedance internal to the integrated circuit;
a first switchable impedance connected in series with the fixed on-chip impedance, the combined first switchable impedance and the fixed on-chip impedance disposed between the source and the output terminal, the first switchable impedance operable to be selectably disposed between the source and the fixed on-chip impedance only in the presence of the first logic state of the input signal;
a second switchable impedance connected in series with the fixed on-chip impedance, the combined second switchable impedance and the fixed on-chip impedance disposed between the sink and the output terminal, the second switchable impedance operable to be selectably disposed between the sink and the fixed on-chip impedance only in the presence of the second logic state of the input signal.

70. The method of claim 69, wherein the first switchable impedance comprises:
a first transistor of a first conductivity type connected between the source and the fixed on-chip impedance, with a defined transconductance associated therewith and conducting only in the presence of the first logic sate of the input signal; and
a second transistor of a second conductivity type opposite the first conductivity type connected between the sink and the fixed on-chip impedance, with a defined transconductance associated therewith and conducting only in the presence of the second logic state of the input signal.

71. The method of claim 59, wherein the voltage on the output terminal is approximately one half of the voltage level of the source when the output terminal is connected to the load in the presence of either the first or second logic states.

72. An method for source terminating an integrated circuit that operates in association with external data transitions having data transitions that occur on a periodic basis at an external data clock rate, and has at least one output terminal and having a calibrated source impedance comprising the steps of disposing in series with the output terminal an on-chip impedance with a value that is fixed to substantially equal an expected finite load impedance, which the on-chip impedance defines the source impedance to the integrated circuit at the output terminal, and which calibrated source impedance is operable to be updated, which update operation is parameterized on the data transitions.

73. The method of claim 72, wherein the output terminal is operable to output a signal having a first logic state and a second logic state, wherein the on-chip impedance defines the input impedance to the integrated circuit at the output terminal for both the first and second logic states.

74. The method of claim 73, wherein the output signal switches between at high frequency and the switchable impedance is operable to switch at the high frequency, and the load impedance comprises a transmission line of a finite impedance at the high frequency.

75. The method of claim 74, wherein the integrated circuit comprises a network controller and the output terminal operates at a data rate as high as 1000 Megabits per second.

76. A method for calibrating a plurality of calibrated impedance terminated output terminals on an integrated circuit operating in association with external data transitions having data transitions that occur on a periodic basis at an external data clock rate and which output terminals are operable to transmit data at a defined rate, comprising the steps of:
associating an on-chip source impedance with each of the output terminals and each disposed internal to the integrated circuit to define the input impedance thereof;
each of the on-chip source impedances variable in response to an associated control signal; and
determining the value of the control signal for each of the on-chip source impedances with a calibration circuit, thereby defining the value of each of the on-chip source impedances in accordance with the calibration of the on-chip source impedances to calibrate for predetermined characteristics thereof, which calibration circuit operates to determine the value of the control signal and then apply it to the associated one of the on-chip source impedances, which operation of applying is parameterized on the data transitions.

77. The method of claim 76, wherein the calibration circuit operates on a periodic basis.

78. A method for calibrating a plurality of calibrated impedance terminated output terminals on an integrated circuit operating in association with external data transitions having data transitions that occur on a periodic basis at an external data clock rate and which output terminals are operable to transmit data at a defined rate, comprising the steps of:
associating an on-chip source impedance with each of the output terminals and each disposed internal to the integrated circuit to define the input impedance thereof;
each of the on-chip source impedances variable in response to an associated control signal; and
determining the value of the control signal for each of the on-chip source impedances with a calibration circuit, thereby defining the value of each of the on-chip source impedances in accordance with the calibration of the on-chip source impedances to calibrate for predetermined characteristics thereof, which calibration circuit operates to determine the value of the control signal and then apply it to the associated one of the on-chip source impedances, which operation of applying is parameterized on the data transitions;
storing the control signal in an update register for at least a group of the on-chip source impedances each having a common value that defines the value thereof as a group for each of the on-chip source impedances therein, and wherein the step of determining with the calibration circuit first determines the control signal for the group and then transfers the determined control signal for the group to the update register in the step of applying.

79. The method of claim 78, wherein the step of determining with the calibration circuit determines the value asynchronous with respect to the data rate, and wherein the transfer operation is synchronous with the data rate.

80. The method of claim 78, wherein ones of the on-chip source impedances are divided into discrete groups, each of the groups having an update register associated therewith for storing therein the associated control signal, the calibration circuit first determining the control signals for each of the groups and then transferring the determined control signals for each of the groups to the associated update registers.

81. The method of claim 80, wherein all of the control signals for all of the groups are the same.

82. The method of claim 81, wherein the update registers are daisy chained, such that the control signals are transferred to a given one of the update registers subsequent to transfer to the subsequent one of the update registers from the given one of the update registers.

83. The method of claim 82, wherein the calibration circuit determines the value asynchronous with respect to the data rate, and wherein the transfer to each of the update registers is synchronous with the data rate.

* * * * *